(12) United States Patent
Hougham et al.

(10) Patent No.: US 8,119,206 B2
(45) Date of Patent: Feb. 21, 2012

(54) NEGATIVE COEFFICIENT OF THERMAL EXPANSION PARTICLES

(75) Inventors: Gareth Geoffrey Hougham, Ossining, NY (US); Xiao Hu Liu, Croton-on-Hudson, NY (US); S. Jay Chey, Ossining, NY (US); Joseph Zinter, Jr., Brewster, NY (US); Michael J. Rooks, Briarcliff Manor, NY (US); Brian Richard Sundolf, Beacon, NY (US); Jon Alfred Casey, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 12/437,263

(22) Filed: May 7, 2009

(65) Prior Publication Data
US 2009/0214780 A1 Aug. 27, 2009

Related U.S. Application Data

(62) Division of application No. 10/702,280, filed on Nov. 6, 2003, now Pat. No. 7,579,069.

(51) Int. Cl.
*B05D 1/36* (2006.01)
(52) U.S. Cl. ......... 427/404; 427/328; 427/214; 427/217
(58) Field of Classification Search ............... 427/248.1, 427/255.25, 402, 404, 405, 372.2
See application file for complete search history.

(56) References Cited

U.S. PATENT DOCUMENTS

| | | | | | |
|---|---|---|---|---|---|
| 2,063,325 | A | * | 12/1936 | McLeod | 428/686 |
| 3,119,713 | A | * | 1/1964 | Hannahs | 427/251 |
| 3,524,754 | A | * | 8/1970 | Bell et al. | 427/306 |
| 3,749,016 | A | * | 7/1973 | Hershkowitz | 102/517 |
| 4,039,297 | A | * | 8/1977 | Takenaka | 428/566 |
| 4,917,857 | A | * | 4/1990 | Jaeckel et al. | 419/9 |
| 4,939,038 | A | * | 7/1990 | Inabata | 428/402 |
| 5,500,287 | A | * | 3/1996 | Henderson | 428/403 |
| 6,132,676 | A | * | 10/2000 | Holzer et al. | 419/20 |
| 6,204,455 | B1 | * | 3/2001 | Gilleo et al. | 174/261 |
| 6,286,206 | B1 | * | 9/2001 | Li | 29/840 |

OTHER PUBLICATIONS

A Dictionary of Metallurgy, A.D. Merriman, MacDonald & Evans, Ltd, 1958, Table of Physical Properties, p. xiv.*

* cited by examiner

*Primary Examiner* — David Turocy
(74) *Attorney, Agent, or Firm* — F. Chau & Associates, LLC; Daniel P. Morris, Esq.

(57) ABSTRACT

A method of forming a negative coefficient of thermal expansion particle includes flattening a hollow sphere made of a first material, annealing the flattened hollow sphere at a reference temperature above a predetermined maximum use temperature to set a stress minimum of the flattened hollow sphere, and forming a coating made of a second material on the flattened hollow sphere at the reference temperature, the second material having a lower coefficient of thermal expansion than that of the first material, the negative coefficient of thermal expansion particle characterized by volumetric contraction when heated.

10 Claims, 5 Drawing Sheets

Heat

Unit volume of elastomer          Significant volumetric expansion with heating

Heat

Single particle          Volumetric shrinkage with heating

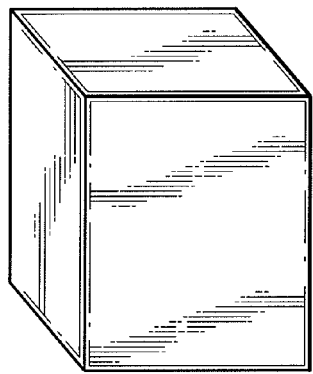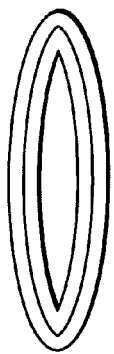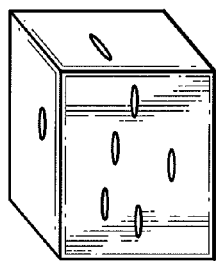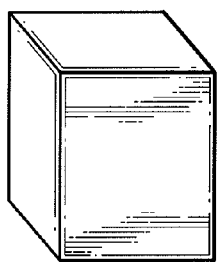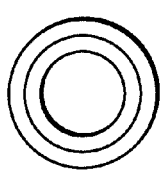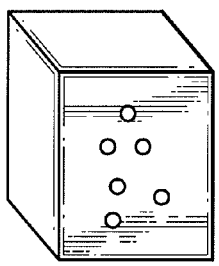
FIG. 9a  FIG. 9b  FIG. 9c

NEGATIVE COEFFICIENT OF THERMAL EXPANSION PARTICLES

CROSS-REFERENCE TO RELATED APPLICATION

This is a Divisional of U.S. patent Ser. No. 10/702,280 now U.S. Pat. No. 7,579,069, filed on Nov. 6, 2003, the disclosure of which is herein incorporated by reference in its entirety.

BACKGROUND OF THE INVENTION

1. Field of the Invention

The present invention relates to altering the coefficient of thermal expansion of materials, including gases, liquids and solids, and, more specifically, the introduction of filler materials into these materials to control the overall coefficient of thermal expansion.

2. Description of the Related Art

In many areas of technology, such as microelectronic packaging, there are circumstances where a mismatch of coefficient of thermal expansion (CTE) between two adjacent materials causes undesirable stresses, which can lead to interfacial failure. This problem has been addressed in many ways. For example, one material can be modified by a filler material to form a composite having a CTE that is more compatible with that of an adjacent material. A simple example might be to add an $SiO_2$ filler to epoxy glue to reduce the epoxy glue's composite CTE to be closer to that of a metal to which it will be adhered.

The problems associated with CTE mismatch are often addressed by the incorporation of many different types of fillers. However, the extent to which the CTE of a material can be thus reduced is limited. The common filler $SiO_2$ has a CTE of about 2 ppm, which is very low compared to organic materials which ordinarily have CTEs in the 50 to 200 ppm range. Only limited volume percent filler can be added before properties other than CTE become significantly affected, which is often undesirable.

A more exotic class of filler used to lower the composite CTE includes those with negative CTEs. Most of these are anisotropic and thus can only impart the desired CTE contribution in one direction. Graphite and Kevlar fibers are examples of negative CTE filler materials. Some very rare materials have volumetrically negative CTEs and the incorporation of these materials can impart lower composite CTEs relative to $SiO_2$. However, most of the volumetrically negative CTE materials have CTEs just slightly below zero ppm, at about −1 ppm, and thus the improvement over $SiO_2$ is only moderate in light of the high cost of these materials. An example of a material having a volumetrically negative CTE is Zirconium Tungstate ($ZrW_2O_8$), produced by Wah Chang of Albany, Oreg.

Thus, a need exists for a relatively inexpensive and highly negative CTE material that can be mixed as a composite with other materials to significantly lower the composite CTE.

SUMMARY OF THE INVENTION

A method of forming a negative coefficient of thermal expansion particle according to an embodiment of the invention includes flattening a hollow sphere made of a first material, annealing the flattened hollow sphere at a reference temperature above a predetermined maximum use temperature to set a stress minimum of the flattened hollow sphere, and forming a coating made of a second material on the flattened hollow sphere at the reference temperature, the second material having a lower coefficient of thermal expansion than that of the first material, the negative coefficient of thermal expansion particle characterized by volumetric contraction when heated.

A method of forming a negative coefficient of thermal expansion particle according to another embodiment of the invention includes forming a metal precursor coating on a thermally decomposeable sacrificial base, burning off the sacrificial base, sintering the metal precursor coating to form an inner shell made of a first metal, and forming a coating made of a second metal on the inner shell at a reference temperature above a predetermined maximum use temperature to set a stress minimum of the negative coefficient of thermal expansion particle, the second metal having a lower coefficient of thermal expansion than that of the first metal, the negative coefficient of thermal expansion particle characterized by volumetric contraction when heated.

BRIEF DESCRIPTION OF DRAWINGS

The invention will be described in detail in the following description of preferred embodiments with reference to the following figures wherein:

FIGS. 9a, 9b and 9c are exploded portional cross sectional views of a contact of an LGA according to an embodiment of the invention.

DESCRIPTION OF PREFERRED EMBODIMENTS

Figure 1:
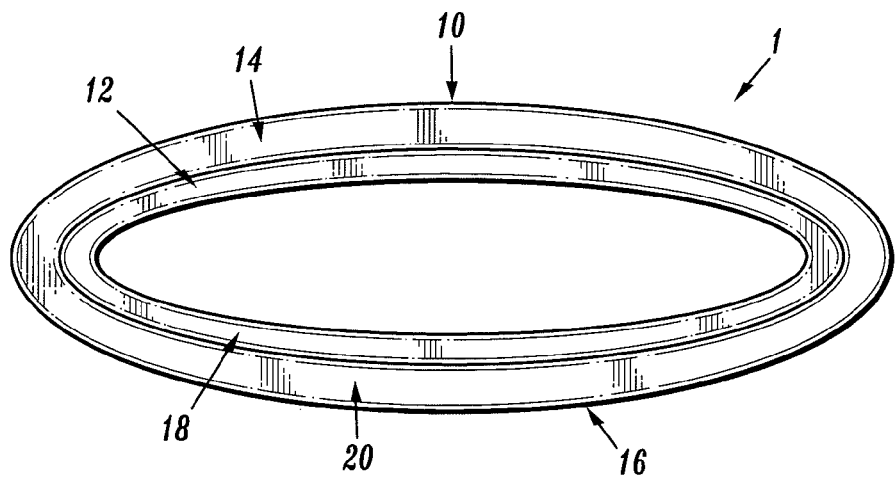
FIG. 1 is a cross sectional view of a negative coefficient of thermal expansion particle according to an exemplary embodiment of the invention.

FIG. 1 is a cross sectional view of a negative CTE particle 1 according to an exemplary embodiment of the invention. The negative CTE particle 1 includes a first bilayer 10 having an inner layer 12 and an outer layer 14, and a second bilayer 16 having an inner layer 18 and an outer layer 20. The inner layer 12 of the first bilayer 10 faces the inner layer 18 of the second bilayer 16. The inner layers 12 and 18 are joined together along a perimeter of the inner layers 12 and 18, and the outer layers 14 and 20 are joined together along a perimeter of the outer layers 14 and 20. The inner layers 12 and 18 have a higher CTE than that of the outer layers 14 and 20. The bilayers 10 and 16 have adequate strength and flexibility such that they will bend elastically in response to temperature induced stress. The bilayers 10 and 16 can be formed of any suitable materials, such as, for example, metals, glass, polymers, metal oxides, carbides, nitrides, and alloys.

Figure 2A:
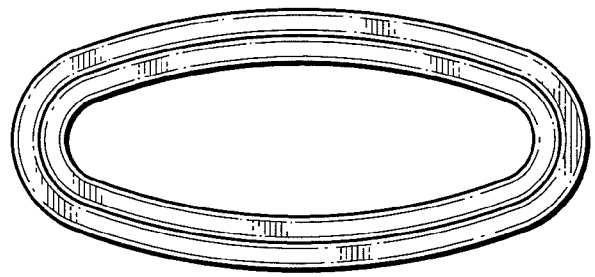
FIGS. 2a and 2b are cross sectional views of a negative coefficient of thermal expansion particle according to an exemplary embodiment of the invention at different temperatures.
Figure 2B:
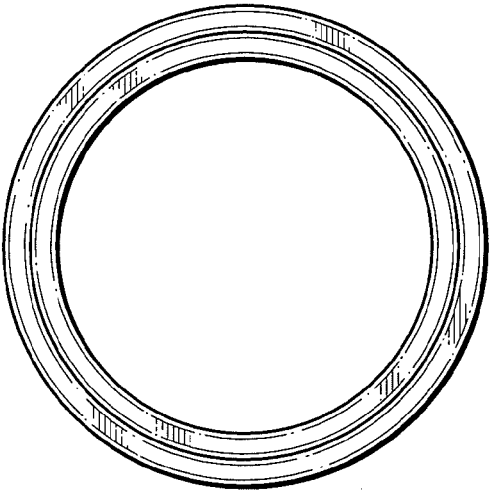

FIGS. 2a-2b show cross sectional views of the negative CTE particle 1 at different temperatures. FIG. 2a illustrates the negative CTE particle 1 at the highest temperature anticipated to be experienced by the negative CTE particle 1 in use. FIG. 2b illustrates the negative CTE particle 1 at a temperature lower than the anticipated highest temperature. The negative CTE particle 1 has the minimum amount of stress at the highest anticipated use temperature. As shown in FIG. 2b, as the temperature of the negative CTE particle 1 decreases below the highest anticipated use temperature, stresses within the negative CTE particle 1 begin to increase and the negative CTE particle 1 expands to fill a larger volume. As the negative CTE particle 1 expands, a cavity 30 within the negative CTE particle 1 is formed and/or grows larger.

Figure 3:
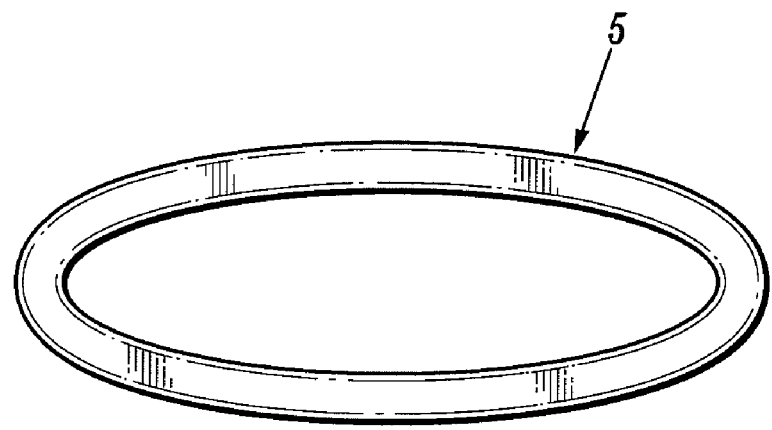
FIGS. 3 and 4 are cross sectional views showing various steps of a method of forming a negative coefficient of thermal expansion particle according to an embodiment of the invention.
Figure 4:
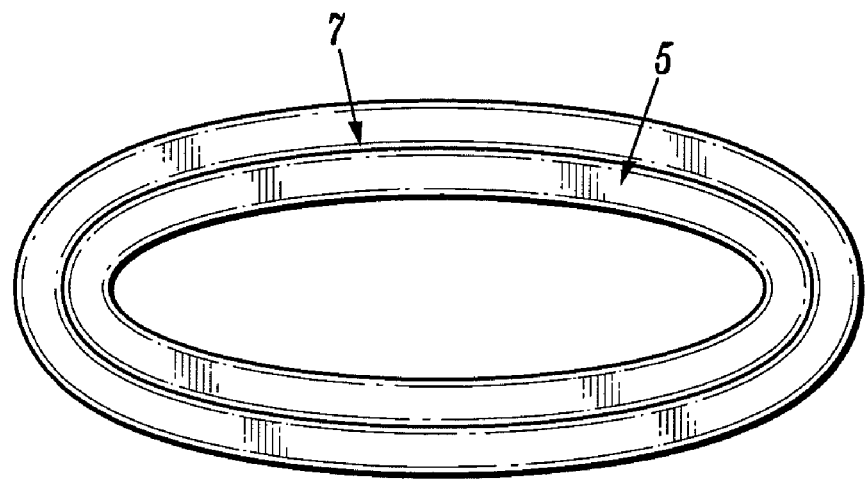

FIGS. 3 and 4 are cross sectional views showing various steps of a method for forming a negative CTE particle according to an exemplary embodiment of the invention. In the present embodiment, micron scale hollow metal spheres 5 are used as a starting material to make bulk negative CTE powders. The hollow metal spheres 5 are manufactured by known techniques and are commercially available from a number of sources. As shown in FIG. 3, the hollow metal spheres 5 are plastically deformed to be substantially flat. This step can be carried out by using any flattening technique, such as, for example, by feeding the metal spheres 5 through a three roll mill in multiple passes and sequentially adjusting the roller gap downward on each pass until the desired flatness is achieved. The internal pressure of the hollow spheres 5 is either high or low relative to atmospheric pressure depending on the manufacturing process of the spheres. If the internal pressure is higher than or at atmospheric pressure, the flattening process could cause the spheres 5 to rupture. Such rupture would be less than ideal, but would not eliminate the negative CTE behavior of the final particles. The flattened spheres 5 form the inner layers 12 and 18 of the negative CTE particles 1.

The flattened spheres 5 are annealed at a reference temperature to reduce residual stresses. The CTE reference temperature is a temperature slightly above the maximum temperature anticipated to be experienced by the negative CTE particle 1 while in use. Thus, the negative CTE particle 1 has a stress minimum just above the maximum use temperature and the stress increases as the temperature decreases through the operating range. For example, in Land Grid Array (LGA) applications, the reference temperature can be chosen to be 130.degree. C. because such a temperature is just above anticipated temperatures near a computer chip.

As shown in FIG. 4, the flattened spheres 5 are coated with a second metal 7 having a lower CTE than the metal forming the spheres 5. The flattened spheres 5 are coated with the second metal 7 while at the CTE reference temperature. The second metal 7 can be coated on the flattened sphere 5 by an suitable technique, such as, for example, electroplating, fluidized bed powder chemical vapor deposition (CVD), sputtering, and evaporating. The second metal coating 7 forms the outer layers 14 and 20 of the negative CTE particle 1.

The resulting negative CTE particle 1 has a dual bilayer structure that will expand volumetrically by controlled stress bending and buckling when cooled. Conversely, the negative CTE particle 1 will contract when heated. Collections of such negative CTE particles 1 can be added to other materials, such as, for example, elastomer polymer to produce a composite having a significantly reduced CTE while retaining other desirable properties.

Figure 5:
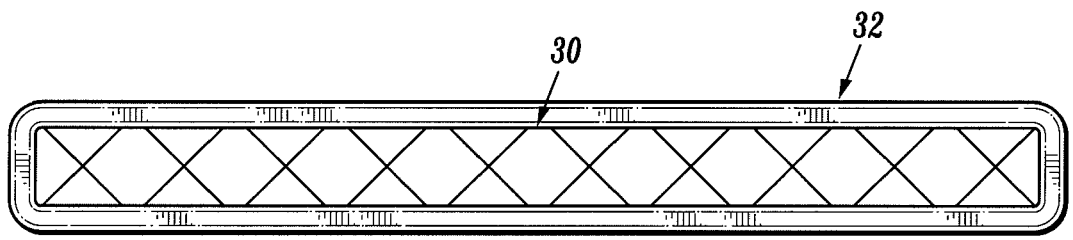
FIGS. 5-7 are cross sectional views showing various steps of a method of forming a negative coefficient of thermal expansion particle according to another embodiment of the invention.
Figure 6:
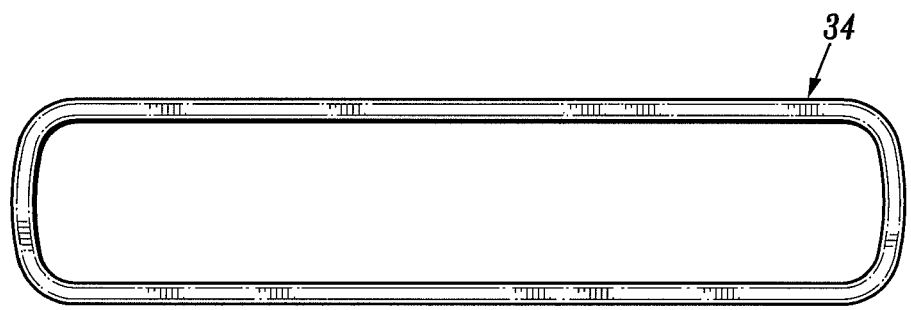
Figure 7:
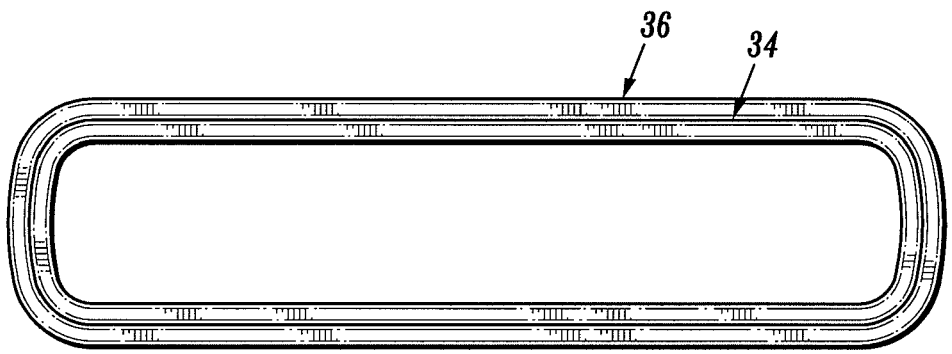

FIGS. 5-7 are cross sectional views showing various steps of a method for forming a negative CTE particle according to another embodiment of the invention. As shown in FIG. 5, a sacrificial base 30 made of thermally decomposable material is coated with a metal precursor 32. The thermally decomposable material can be, for example, polystyrene and PMMA (poly(methyl methacrylate)). In the present embodiment the sacrificial base 30 is formed in a flat disk shape. However, it should be appreciated that in other embodiments the sacrificial base 30 could be formed in any suitable shape depending on the desired final shape of the negative CTE particle.

The metal precursor 32 forms a continuous coating around the sacrificial base 30. The metal precursor 32 can be, for example, copper formate and can be deposited by any suitable method, such as, for example, a CVD process.

As shown in FIG. 6, the sacrificial base 30 is burned off and the metal precursor is sintered to produce a hollow shell 34. The hollowed shell 34 forms the inner layers 12 and 18 of the negative CTE particle 1. If the metal precursor is copper formate, the sintering process results in a hollowed shell 34 formed of copper. The gas released as the sacrificial base 30 thermally decomposes is able to escape via porosity in the metal precursor coating 32.

As shown in FIG. 7, the hollow shell 34 is coated with a second material 36 having a lower CTE than the material forming the hollow shell 34. The hollow shell 34 is coated with the second material 36 while at a CTE reference temperature. As discussed for the previously described embodiment, the CTE reference temperature is a temperature slightly above the maximum temperature anticipated to be experienced by the negative CTE particle 1 while in use. If the hollow shell 34 is made of copper, the second material 36 can be, for example, metallic tungsten or a tungsten precursor.

The second material 36 can be coated on the hollow shell 34 by an suitable technique, such as, for example, electroplating, fluidized bed powder CVD, sputtering, and evaporating. The second material 36 forms the outer layers 14 and 20 of the negative CTE particle 1.

The negative CTE particles according to exemplary embodiments of the invention have many applications. For example, the control of thermal expansion is particularly important in elastomers (e.g. rubber), which have a notoriously high expansion coefficient limiting their use in many high technology applications. Of particular interest is the fabrication of small conducting elastomer contacts for high-end microelectronic packaging. In conventional examples of such contacts, an electrically conducting material such as metallic silver particles are mixed with siloxane rubber and the resulting mixture is molded into small conducting contacts. These contacts are fabricated into a 2-dimensional array and used as a Land Grid Array (LGA) connection between a chip module and a printed circuit board. LGAs require constant application of force to maintain good electrical contact. This force in combination with the higher temperatures encountered near powered chips causes a slow plastic deformation (creep) in metal-filled elastomer type LGAs. Usually, the LGA contacts have a larger CTE than the other materials in contact with the LGA contacts, namely the chip modules, the circuit boards, the LGA frame, and other components which in combination establish the gap between the chip module and the circuit board which the LGA bridges. The creep can eventually eliminate the excess force required as a buffer to the loss of force that occurs as a result of differential CTEs any time the local environment decreases in temperature.

Figure 8:
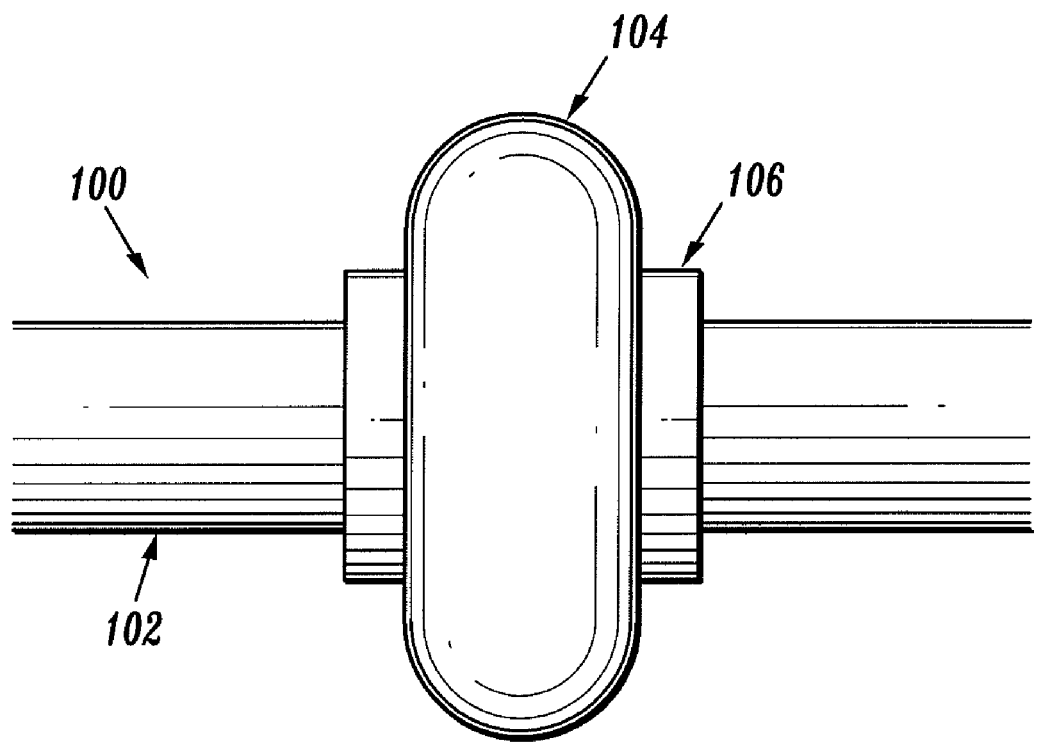
FIG. 8 is a cross sectional view of a portion of a Land Grid Array (LGA) according to an embodiment of the invention.

A solution to the above problem involves lowering the CTE of the elastomer contacts. The CTE of the elastomer contacts can be lowered by using the negative CTE particles according to the invention as a filler material in the contacts. FIG. 8 is a cross-sectional view of a portion of an LGA 100 according to an embodiment of the invention. The LGA 100 includes a carrier sheet 102 and a plurality of contacts 104 held in place in the carrier sheet 102 by metal bands 106. FIGS. 9a and 9b are exploded portional cross sectional views of a contact 104 of an LGA according to an embodiment of the invention at different temperatures. The contact 104 is made of a composite material containing a plurality of negative CTE particles 108 randomly dispersed as a filler in a matrix elastomer 110, e.g. siloxane or rubber.

The contact 104 is at a low temperature in FIG. 9a, and at a relatively higher temperature in FIG. 9b. As shown in FIG. 9a, when the temperature is lowered, the elastomer 110 in the contact 104 will contract according to its CTE, but the negative CTE particles 108 will expand. As shown in FIG. 9b, when the temperature is raised, the elastomer 110 in the contact 104 will expand according to its CTE, but the negative CTE particles 108 will contract. Thus, the overall resulting composite expansion and contraction is a function of the mix ratio and the CTE values for both the elastomer and the negative CTE particles. Depending on the value of these variables, the composite will give a net zero volume change upon temperature change, a net volume expansion upon cooling, or a net contraction at a reduced extent than would occur in the absence of the negative CTE particles. Accordingly, an LGA having contacts made with negative CTE particle filler according to the invention has a considerably longer lifetime compared to conventional electrical connection devices.

Another specific application would be to mix the negative CTE particles of the invention into epoxy prepreg used to make circuit boards. This would decrease the CTE mismatch between circuit boards and the much lower CTE silicon chips. These mismatches are the cause of many device failures which, if eliminated, would lead the way for the fabrication of currently impossible electronic components. For example, the mismatch between low dielectric constant organic epoxy circuit boards and the silicon of which chips are constructed prevents the widespread implementation of organic packaging, in which chips are attached directly to prepreg circuit boards bypassing the expensive and signal-slowing carrier modules. The implementation of negative CTE particles according to the invention in the organic circuit boards allows such direct chip connections to become possible.

In other applications, negative CTE particles according to exemplary embodiments of the invention can be included in any type of material to alter the CTE of the material. For example, negative CTE particles according to the invention can be added to an organic thermoset polymer network, such as an adhesive. This would have the effect of lowering the CTE of the elastomer while maintaining elastomeric properties. Negative CTE particles according to the invention can be added to a liquid so that the combined CTE of the liquid would be lowered or rendered zero. In still other applications, negative CTE particles according to the invention can be added to a confined gas to modify the overall CTE of the gas. This would be particularly useful in moderating gas pressure changes.

Although the illustrative embodiments have been described herein with reference to the accompanying drawings, it is to be understood that the present invention and method are not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of forming a negative coefficient of thermal expansion particle, comprising:
   flattening a hollow sphere made of a first material;
   annealing the flattened hollow sphere at a reference temperature above a predetermined maximum use temperature to set a stress minimum of the flattened hollow sphere; and
   forming a coating made of a second material on the flattened hollow sphere at the reference temperature, the second material having a lower coefficient of thermal expansion than that of the first material,
   the negative coefficient of thermal expansion article characterized by volumetric contraction when heated.

2. The method of claim 1, wherein the first and second materials are metals.

3. The method of claim 1, wherein the step of forming a coating on the hollow sphere comprises chemical vapor deposition.

4. The method of claim 1, wherein a stress in the flattened hollow sphere decreases to the stress minimum with an increase in temperature up to the predetermined maximum use temperature.

5. A method of forming a negative coefficient of thermal expansion particle, comprising:
   forming a metal precursor coating on a thermally decomposeable sacrificial base;
   burning off the sacrificial base;
   sintering the metal precursor coating to form an inner shell made of a first metal; and
   forming a coating made of a second metal on the inner shell at a reference temperature above a predetermined maximum use temperature to set a stress minimum of the negative coefficient of thermal expansion particle, the second metal having a lower coefficient of thermal expansion than that of the first metal,
   the negative coefficient of thermal expansion particle characterized by volumetric contraction when heated.

6. The method of claim 5, wherein the step of burning off the sacrificial base is done simultaneously with the step of sintering.

7. The method of claim 5, wherein the metal precursor is copper formate.

8. The method of claim 7, wherein the first metal is copper and the second metal is tungsten.

9. The method of claim 5, wherein the sacrificial base is made of polystyrene.

10. The method of claim 5, wherein a stress in the negative coefficient of thermal expansion particle decreases to the stress minimum with an increase in temperature up to the predetermined maximum use temperature.

* * * * *